United States Patent
Farokhzad

[19]

[11] Patent Number: 5,877,419
[45] Date of Patent: Mar. 2, 1999

[54] METHOD FOR ESTIMATING THE SERVICE LIFE OF A POWER SEMICONDUCTOR COMPONENT

[75] Inventor: Babak Farokhzad, Lenfelden-Echterdingen, Germany

[73] Assignee: Siemens Aktiengesellschaft, Munich, Germany

[21] Appl. No.: 811,289

[22] Filed: Mar. 4, 1997

[30] Foreign Application Priority Data

Mar. 14, 1996 [DE] Germany ............... 196 10 065.8

[51] Int. Cl.⁶ ............................................. G01R 31/26
[52] U.S. Cl. ...................... 73/432.1; 324/769; 324/765
[58] Field of Search .......................... 73/432.1; 324/719, 324/765, 766, 768, 769

[56] References Cited

U.S. PATENT DOCUMENTS

| | | | |
|---|---|---|---|
| 3,882,391 | 5/1975 | Liles et al. | 324/769 |
| 3,889,188 | 6/1975 | Trindale | 324/769 |
| 4,520,448 | 5/1985 | Tremintin | 324/768 X |
| 5,281,872 | 1/1994 | Mori . | |
| 5,325,054 | 6/1994 | Houston | 324/769 |
| 5,420,513 | 5/1995 | Kimura | 324/765 X |
| 5,486,772 | 1/1996 | Hshieh et al. | 324/768 X |
| 5,521,524 | 5/1996 | Houston | 324/769 X |
| 5,548,224 | 8/1996 | Gabriel et al. | 324/769 X |
| 5,617,038 | 4/1997 | Houston | 324/765 |
| 5,625,300 | 4/1997 | Sachdev | 324/769 X |
| 5,650,336 | 7/1997 | Eriguchi et al. | 324/719 X |

FOREIGN PATENT DOCUMENTS

| | | |
|---|---|---|
| 42 13 606 A1 | 10/1992 | Germany . |
| 63-228084 | 9/1988 | Japan ................ 324/769 |
| 63-253270 | 10/1988 | Japan ................ 324/769 |

OTHER PUBLICATIONS

"Prediction of Failure Rate of Field Effect Transistors" D. C. Trindade, IBM Technical Disclosure Bulletin, vol. 16 No. 10, Mar. 1974.

H. De Lambilly, et al., *Failure Analysis of Power Modules: A Look at the Packaging and Reliability of Large IGBT'S*, IEEE Transactions on Components, Hybrids and Manufacturing Technology, vol. 16, No. 4, Jun. 1, 1993, pp. 412–417.

W. P. Bennett, et al., *Reliability of New Plastic–Packaged Power Transistors for Consumer Applications*, IEEE Transactions on Broadcast and Television Receivers, Oct. 24, 1994, pp. 322–331.

Derwent Patent Abstracts, English translation Abstract of DE 4213606, Oct. 29, 1992 (Toyoda Jidoshokki Seisakusho).

Derwent Patent Abstracts, English translation Abstract of DE 68289, Aug. 5, 1969 (J. Ludwig).

P. Jacob, et al., *Reliability Testing and Analysis of IGBT Power Semiconductor Modules*, Proceedings of the 20th International Symposium for Testing and Failure Analysis, Los Angeles, Nov. 13–18, 1994, pp. 319–325.

H. Koschel, et al., *Zeitraffende Zuverlässigkeitsprüfungen an Transistoren*; offprint from *Nachrichtentechnische Zeitschrift*, No. 5 (1964).

Primary Examiner—Ronald L. Biegel
Assistant Examiner—Paul D. Amrozowicz
Attorney, Agent, or Firm—Hill & Simpson

[57] ABSTRACT

A method which exploits the phenomenon that an increase of the collector-emitter voltage $U_{CE}$ of a semiconductor power component during a load change test can be correlated with the service life expectancy of the relevant IGBT module. A method for estimating the service life of a power semiconductor component, comprising the steps of subjecting the component to a periodic load change, measuring an electrical parameter P of the component that serves as an indicator for reliability or durability against the number N of load changes, calculating a derivative dP/dN of the electrical parameter P according to the number N of load changes; and comparing the derivative dP/dN with a target value representing a determined service life. The characteristic "longer-lived than a reference module" or, respectively, "more resistant to failure" can be allocated to a test module if the derivatives of the respective voltage $U_{CE}$ satisfy the condition $(dU_{CE}/dN)_{Test} < (dU_{CE}/dN)_{Ref}$ after the number N of load changes.

10 Claims, 6 Drawing Sheets

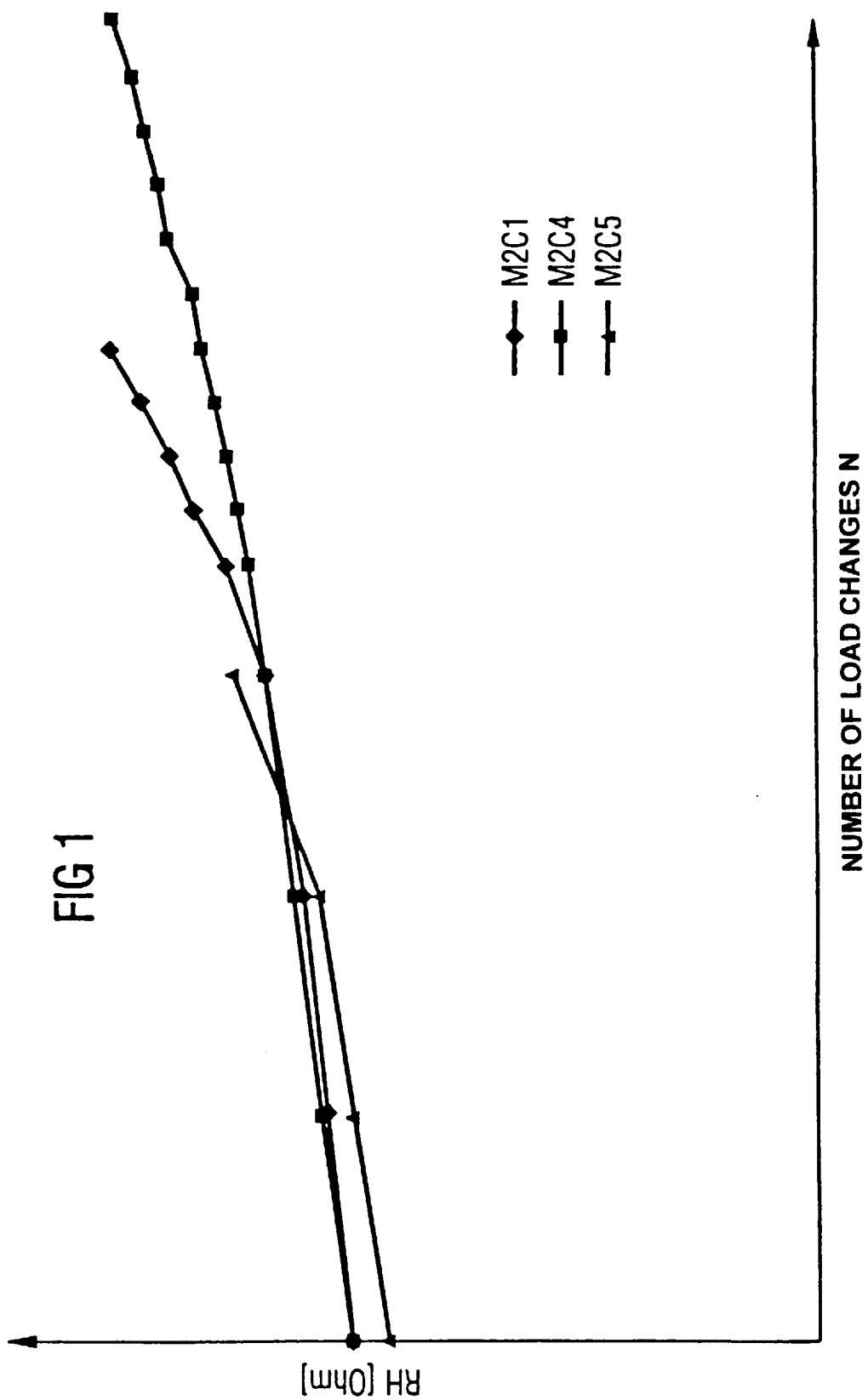

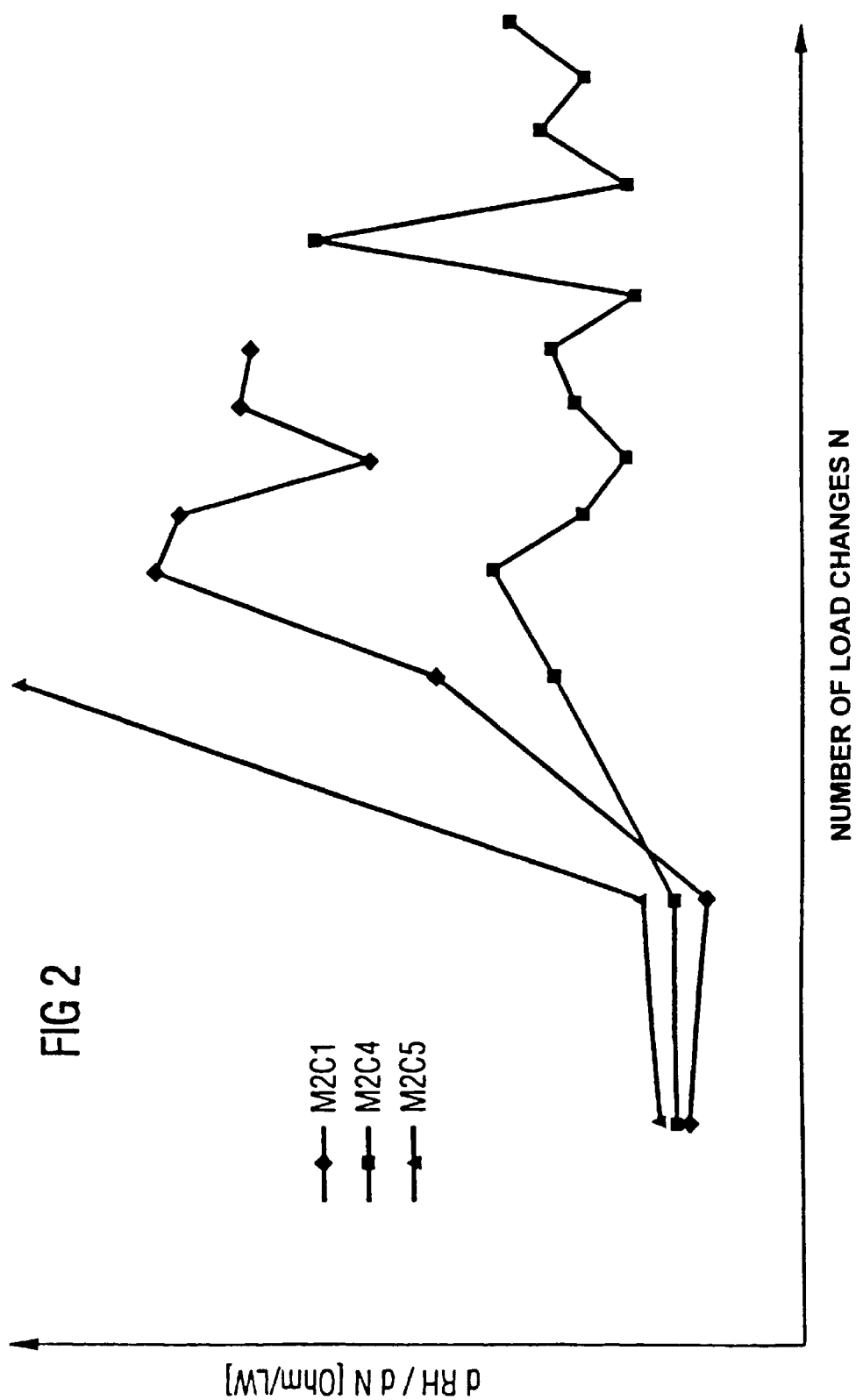

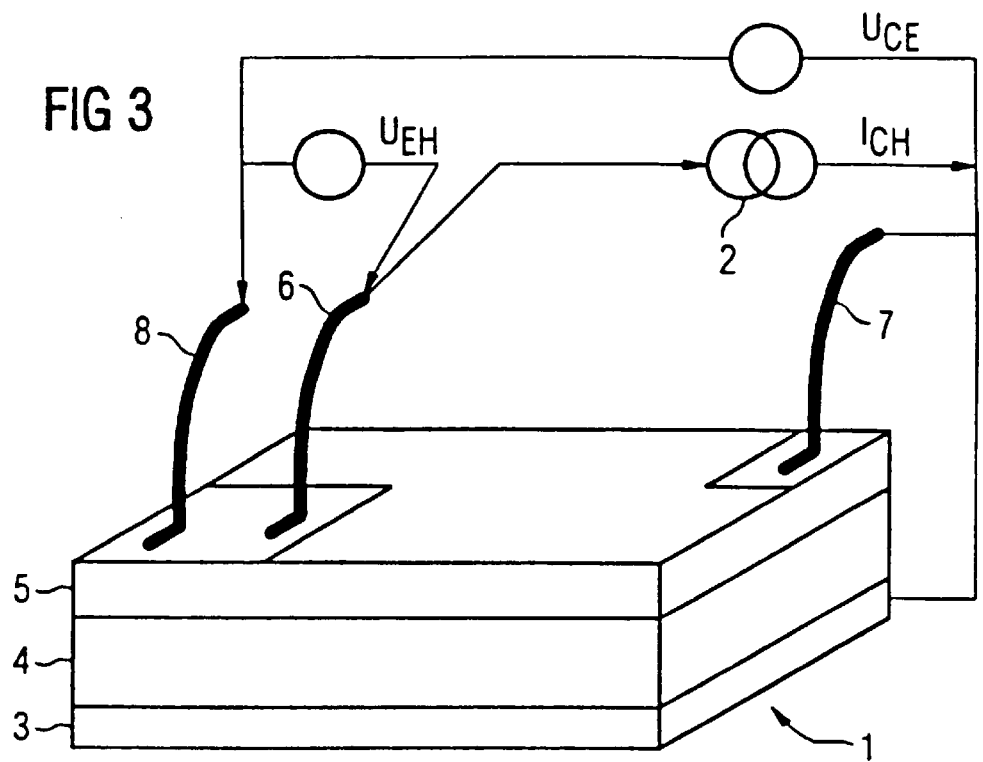
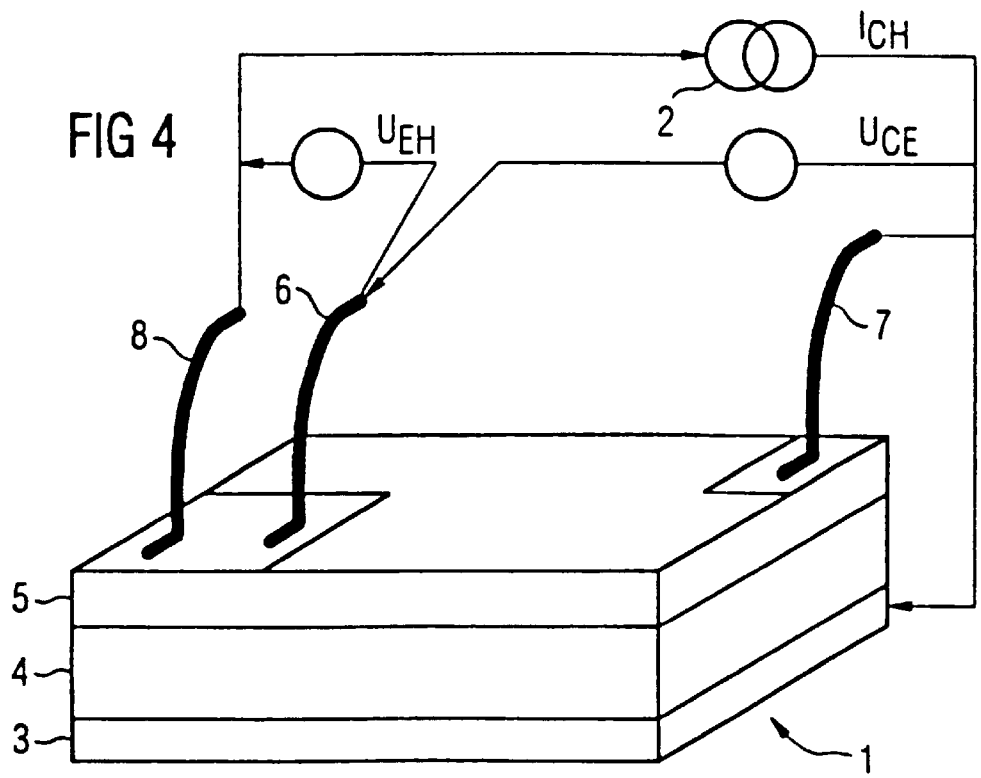

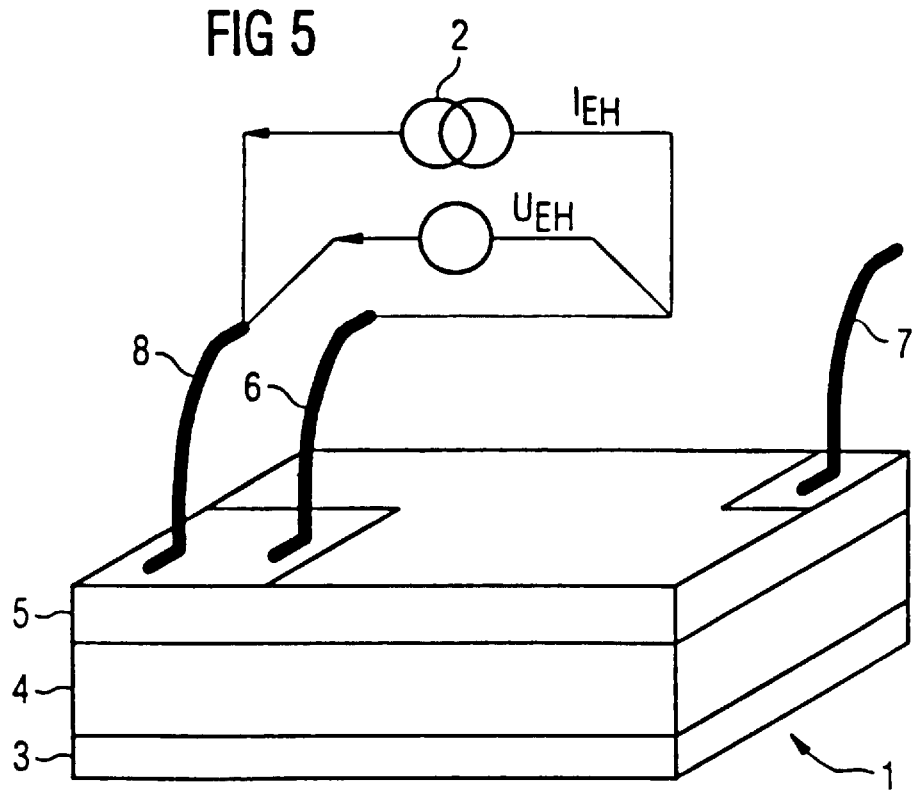

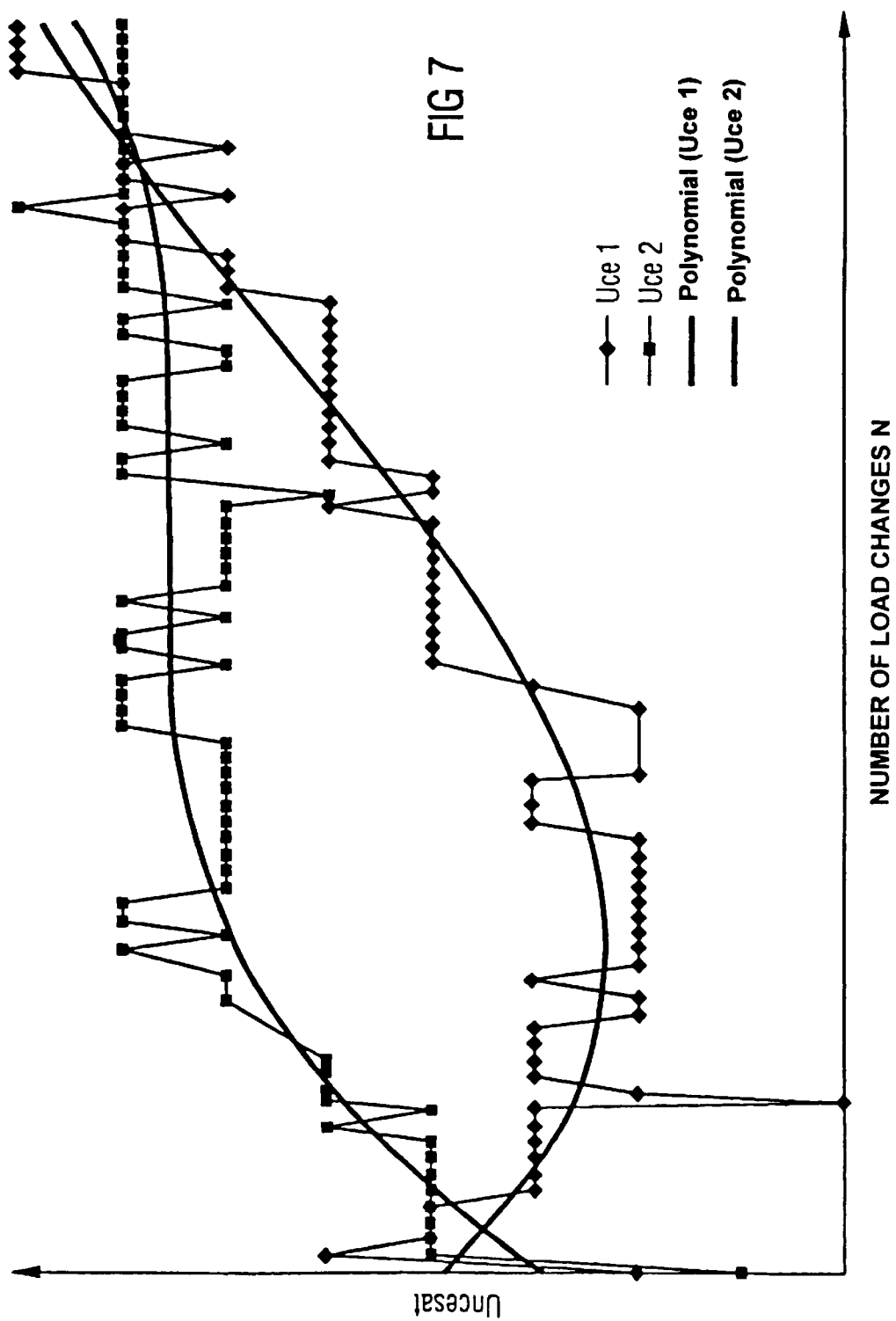

METHOD FOR ESTIMATING THE SERVICE LIFE OF A POWER SEMICONDUCTOR COMPONENT

BACKGROUND OF THE INVENTION

Due to their excellent electrical characteristics and comparatively simply constructed trigger electronics, IGBT (Isolated Gate Bipolar Transistor) power semiconductor modules increasingly are being used, even in failure-critical systems. Since traction control units of track-bound vehicles (locomotives, streetcars and subway trains, etc.) are often subjected to large mechanical and thermal stresses during their often decades-long service life, the users place the highest demands on the reliability and service life of the IGBT modules used.

Currently, there is no standardized method for testing the reliability of IGBT power semiconductor modules. A group of research institutes, manufacturers and users has concerned itself with this problem, and has discussed a corresponding test method. See, *Proceedings of the 20th International Symposium for Testing and Failure Analysis*, Los Angeles, Nov. 13–18, 1994, pp. 319–325, incorporated herein by reference.

According to the recommendations of this group, an IGBT module should be subjected to a plurality of load changes under defined conditions, and, in particular, should be rated as defective or faulty when the collector-emitter voltage ($U_{CEsat}$), measured after several thousand cycles, deviates from an initial value by more than a predetermined percentage (20% divided by the number of chips in the module). Even if this condition is relaxed and a drop off of 10% below the initial voltage is still tolerated, in long-life modules the corresponding degradation first arises after some hundreds of thousands of load changes. Since the duration of the cycle ($t_{on}+t_{out}$) is typically in the range from about 10 to 20 seconds, the test of reliability/service life requires a measurement time of several weeks or even months, which is far too long for routine control in production.

A method for testing the reliability of electronic components specified in H. Koschel, et al., *Zeitraffende Zuverlässigkeitsprüfungen an Transistoren; offprint from Nachrichtentechnische Zeitschrift*, No. 5 (1964), incorporated by reference, rests on the assumption that an increase in the loading of a test object results in an acceleration of the failure mechanism. As long as the failure mechanism is maintained, the test time can then be shortened corresponding to what is called an acceleration curve. The individual points of the acceleration curve are obtained from a plurality of failure distribution curves, measured respectively from samples of test objects, using a mathematical model that approximately describes the expected distribution of the service life.

SUMMARY OF THE INVENTION

The present invention provides a test method that makes it possible to carry out an early estimation of the service life of a power semiconductor component or, respectively, to allocate the characteristic "longer-lived than a reference element" or "shorter-lived than a reference element" to the component after comparatively few load changes.

In an embodiment, the invention provides a method for estimating the service life of a power semiconductor component, comprising the steps of subjecting the component to a periodic load change; measuring an electrical parameter P of the component that serves as an indicator for reliability or durability against the number N of load changes; calculating a derivative dP/dN of the electrical parameter P according to the number N of load changes; and comparing the derivative dP/dN with a target value representing a determined service life.

This method can be used in particular in the area of development and manufacturing of IGBT power semiconductor modules. It makes it possible to determine after a relatively short time which of the technologies examined offers the greatest advantages with respect to the reliability/durability of the modules, and which process parameters still require an optimization if warranted. Inserted into the quality control, samples taken from the running production can be tested more rapidly than before, and the corresponding batch can be released for delivery to the customers.

In an embodiment, the invention provides a method wherein the derivative dP/dN is compared with a derivative $(dP/dN)_{Ref}$, measured for a reference element under the same conditions and within the same interval of N load changes.

In an embodiment, the invention provides a method wherein the component is rated as longer-lived in relation to the reference element as long as the condition $$dP/dN < (dP/dN)_{Ref}$$

is satisfied within the interval of N load changes and in that the component is rated shorter-lived in relation to the reference element as long as the condition $$dP/dN > (dP/dN)_{Ref}$$

is satisfied within the interval of N load changes.

In an embodiment, the invention provides a method wherein at least a second derivative $d^2P/dN^2$ is calculated and compared with a corresponding second derivative $(d^2P/dN^2)_{Ref}$ of the reference element.

In an embodiment, the invention provides a method wherein a warning signal is produced if the derivative dP/dN is larger than the target value.

In an embodiment, the invention provides a method wherein the parameter P is selected from the group consisting of a potential difference between two terminals of the component, an ohmic resistance between two terminals or an ohmic resistance of a component terminal.

In an embodiment, the invention provides a method wherein the power semiconductor component comprises an emitter terminal, an auxiliary emitter terminal and a collector terminal, a resistance ($R_{EH}$) between the emitter terminal and the auxiliary emitter terminal, a resistance of the emitter ($R_E$) or a resistance of the auxiliary emitter ($R_H$), or a collector-emitter voltage ($U_{CEsat}$) is measured against the number N of load changes.

In a further embodiment, the invention provides a method for estimating the service life of a power semiconductor component, comprising the steps of subjecting the component to a periodic load change, measuring an electrical parameter P of the component that serves as an indicator for reliability or durability against the number N of load changes, calculating a derivative dP/dN of the electrical parameter P according to the number N of load changes, and comparing the derivative dP/dN with a target value representing a determined service life, wherein the derivative dP/dN is compared with a derivative $(dP/dN)_{Ref}$, measured for a reference element under the same conditions and within the same interval of N load changes, wherein at least a second derivative is calculated, wherein the parameter P is selected from the group consisting of a potential difference between two terminals of the component, an ohmic resistance between two terminals or an ohmic resistance of a component terminal, and wherein the power semiconductor component comprises an emitter terminal, an auxiliary emitter terminal and a collector terminal, a resistance ($R_{EH}$) between the emitter terminal and the auxiliary emitter terminal, a resistance of the emitter ($R_E$) or a resistance of the auxiliary emitter ($R_H$), or a collector-emitter voltage ($U_{CEsat}$) is measured against the number N of load changes.

In an embodiment, the invention provides a method as set forth above wherein the component is rated as longer-lived in relation to the reference element as long as the condition $$dP/dN < (dP/dN)_{Ref}$$

is satisfied within the interval of N load changes and in that the component is rated shorter-lived in relation to the reference element as long as the condition $$dP/dN > (dP/dN)_{Ref}$$

is satisfied within the interval of N load changes.

In an embodiment, the invention provides a method as set forth above wherein a warning signal is produced if the derivative dP/dN is larger than the target value.

These and other features of the invention are discussed in greater detail below in the following detailed description of the presently preferred embodiments with reference to the accompanying drawings.

BRIEF DESCRIPTION OF THE DRAWINGS

FIG. 1 illustrates a plot of the dependence of auxiliary emitter resistance ($R_H$) of different IGBT components of a module on the number (N) of load changes.

FIG. 2 illustrates a plot of the change in the slope ($dR_H/dN$) of the auxiliary resistances, depending on the number (N) of load changes.

FIG. 3 illustrates the connection of an IGBT component during the measurement of the auxiliary emitter resistance ($R_H$).

FIG. 4 illustrates the connection of an IGBT component during the measurement of the emitter resistance ($R_E$).

FIG. 5 illustrates the connection of an IGBT component during the measurement of the resistance ($R_{EH}$) between the emitter and the auxiliary emitter.

FIG. 7 illustrates a plot of the collector-emitter voltages ($U_{CEsat}$) of two IGBT power semiconductor modules, depending on the number (N) of load changes, as well as the respectively calculated compensating polynomials.

DETAILED DESCRIPTION OF THE PRESENTLY PREFERRED EMBODIMENTS

Figure 6:
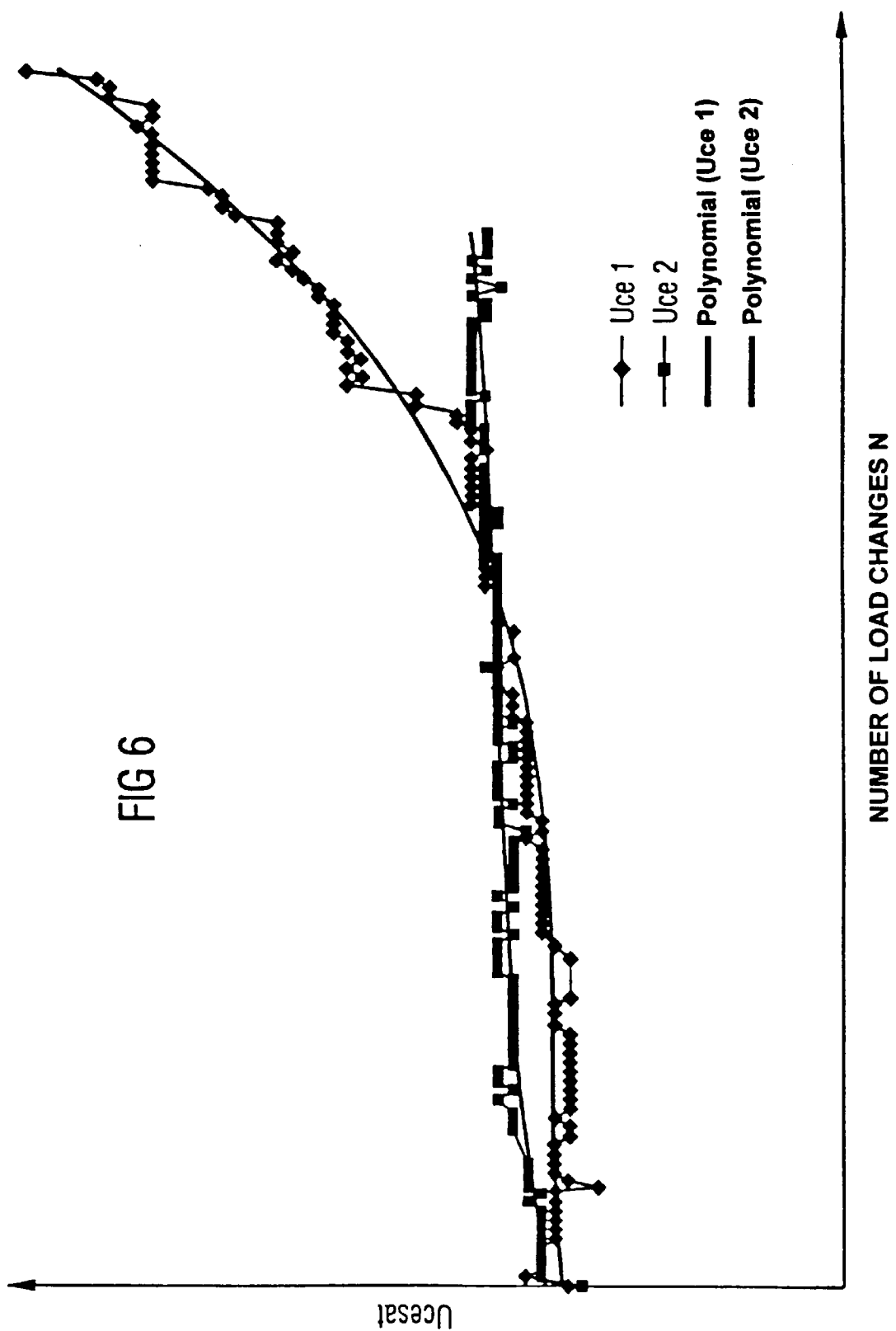
FIG. 6 illustrates a plot of the collector-emitter voltages ($U_{CEsat}$) of two IGBT power semiconductor modules, depending on the number (N) of load changes, as well as the respectively calculated compensating polynomials.

Since the electrical terminals, usually made of aluminum, of an IGBT component and the silicon chip to be contacted have thermal expansion coefficients of different magnitudes, mechanical shear forces arise in the region of the bond wires during operation. As a consequence of these shear forces, fine hairline cracks can form in the metal, which grow continuously and gradually detach the bond wire from its base. The bond wire can then finally disengage from the metallization, and thereby interrupt the current and voltage supply of the IGBT component (see FIGS. 3–6 in *Proceedings of the 20th International Symposium for Testing and Failure Analysis*, Los Angeles, Nov. 13–18, 1994, pp. 319–325), incorporated by reference. This mechanism most often leads to the failure of the IGBT module, which consists of several components, whereby the auxiliary emitters not loaded with current during operation mostly disengage, at least at small currents, before the respective main emitters.

In accordance with the invention, the degradation of the bond wires leads to a change in the bond wire resistance, so that this resistance can serve as an indicator for the reliability/durability of the respective terminal, and thus for the service life of the component or, respectively, of the relevant IGBT module. In the context of corresponding investigations, it has turned out that the faster the bond wire resistance increases with time or, respectively, with the number N of load changes carried out, the earlier a component of the module fails due to the disengaging of a bond wire. FIG. 1 shows the results of the measurements carried out on three of the total of six components (10A, 600 V) of an IGBT module. The resistance $R_H$ of the respective auxiliary emitter is shown plotted against the number N of load changes. The test parameters are indicated next in Table I:

TABLE I

| Test Parameters | |
|---|---|
| Input/output time per cycle | $t_{on}$ = 10 sec.; $t_{off}$ = 20 sec. |
| Temperature spread | $\Delta T$ = 100 K |
| Number of cycles | $N \approx 10^4$ |
| Gate voltage | $U_G$ = 15 volts |
| Collector current | $I_c$ = 3 A |

The strongest increase was shown by the resistance $R_H$ of the auxiliary emitter, measured at component M2C5. This component also failed, due to disengagement of the emitter bond wire, already after about half the planned number of load changes. The component M2C1 was somewhat longer-lived. At the beginning, the resistance of its auxiliary emitter already had approximately the same time dependence as the auxiliary emitter resistance of the component M2C4, which was the longest-lived in the load change test that was carried out. The failure of the component M2C1 made itself known in advance, after about half the measurement time, through a stronger increase in the auxiliary emitter resistance. The resistance of the auxiliary emitter measured at component M2C4 did not reach failure-critical values until much later.

The correlation between the curve of the auxiliary emitter resistance $R_H$ and the expected service life of the respective IGBT component can also be established on the basis of FIG. 2. There, the slope $dR_H/dN$ of the respective auxiliary emitter resistance $R_H$ is shown plotted against the number N of load changes. It can be seen clearly that an IGBT component fails earlier the more strongly the resistance $R_H$ of its auxiliary emitter increases with time. Through comparison of the derivative $dR_H/dN$, measured at a test element, with the corresponding value $(dR_H/dN)_{Ref}$ of a reference element, the characteristic "shorter-lived than the reference element" $(dR_H/dN > (dR_H/dN)_{Ref})$ or "longer-lived than the reference element" $(dR_H/dN < (dR_H/dN)_{Ref})$ can thus already be allocated to the test element after comparatively few load changes. If the test element and the reference element are respectively the most failure-susceptible components of their unit, then the relevant test module is also shorter-lived/longer-lived than the reference module.

For the measurement of the resistance $R_H$, the load change test is broken off short and the IGBT component 1 is connected with a controllable source of direct current 2 in such a way that the current $I_{CH}$, respectively fed into the collector 3, flows via the semiconductor chip 4 and the upper metallization 5 to the auxiliary emitter 6, and from there to the source 2 (see FIG. 3). The gate terminal 7, separated from the semiconductor chip 4 by an insulator, remains without current, as does the emitter terminal 8. After recording the voltage drop $U_{EH}$ across the emitter 8 and the auxiliary emitter 6, the current strength $I_{CH}$ is altered, in order to carry out at least one additional measurement of the potential difference $U_{EH}$. The slope of the $U_{EH}/I_{CH}$ characteristic curve, obtained for example by means of a linear regression, then supplies the sought resistance $R_H$.

As explained above, the bond wire 8, serving as the emitter terminal, is also subject to degradation. Hairline cracks, caused by strong shear forces, influence the contact resistance, so that through measurement of the emitter resistance $R_E$ or of the resistance $R_{EH}$ between the emitter 8 and the auxiliary emitter 6, the bond wire quality can be judged and the service life of the relevant component or, respectively, IGBT module can be estimated. Thus, a component 1 has a longer service life expectancy than a component 2 if the derivatives satisfy the condition:

$$(dR_E/dN)_1 < (dR_E/dN)_2$$

or, respectively $$(dR_{EH}/dN)_1 < (dR_{EH}/dN)_2.$$

The corresponding measurement constructions are shown schematically in FIG. 4 ($R_E$ measurement) and FIG. 5 ($R_{EH}$ measurement).

Larger IGBT power semiconductor modules usually have no auxiliary emitter bonded immediately to the semiconductor chips. In order to estimate the expected service life of these modules, it is advantageous to examine the degradation of the collector-emitter saturation voltage $U_{CEsat}$ during a load change test, and in particular the slope $dU_{CEsat}/dN$. FIG. 6 shows the saturation voltages $U_{CEsat}$ measured respectively for two IGBT modules (300 A, 1600 V) plotted against the number N of load changes and the allocated third-degree compensation polynomials (solid curves). The two modules can be distinguished from one another essentially in that different technologies were respectively used during their manufacture. The load change test was broken off when the saturation voltage $U_{CEsat}$ of module No. 1 deviated from its initial value by 10%. On the basis of the slope $dU_{CEsat}/dN$ of the saturation voltage $U_{CEsat}$ or, respectively, the slope of the allocated compensation polynomial, it can be predicted with high probability, after about ⅔ of the testing time at the latest, that module 1 will satisfy the failure criterion (10% deviation of the $U_{CEsat}$ voltage from its initial value) earlier than module 2. The relevant time region for the prognosis of the service life expectancy is shown in FIG. 7. In contrast to FIG. 6, in the calculation of the compensation polynomials only the data already present after about half the measurement time were taken into account. The greater slope of the polynomial allocated to module No. 1, after a starting phase, can be seen clearly. Since the second derivatives also satisfy the condition $$(d^2U_{CEsat}/dN^2)_1 > (d^2U_{CEsat}/dN^2)_2,$$

module 1 can also be allocated the characteristic "shorter-lived than module 2" with high certainty after about half the planned load changes.

If the service life expectancy of a module is carried out through analysis of the $U_{CEsat}$ curve already after comparatively few load changes, this necessarily leads to an increased uncertainty of the prognosis. Thus, in addition to the first and second derivative of the saturation voltage $U_{CEsat}$ the recorded degradation curves should, if necessary, be subjected to another time series analysis, trend analysis or spectral analysis. Corresponding methods are known from the field of statistics.

The method specified above is used particularly in the fields of research, development and quality assurance. The possibility of classifying IGBT components and IGBT modules according to their service life expectancy through analysis of the recorded degradation curves ($R_H$, $R_E$, $R_{EH}$ and $U_{CEsat}$ curves) can however also be used advantageously in traction systems. The control unit, computer-controlled in any case, can for example periodically query the $U_{CEsat}$ voltages of the individual components, analyze the recorded curves and produce a warning signal if one of the voltages $U_{CEsat}$ or, respectively, its slope $dU_{CEsat}/dN$ reaches a critical value that signals imminent failure.

Although modifications and changes may be suggested by those skilled in the art, it is the intention of the inventors to embody within the patent warranted hereon all changes and modifications as reasonably and properly come within the scope of their contribution to the art.

What is claimed is:

1. A method for estimating the service life of an IGBT, comprising the steps of:

subjecting the IGBT to a periodic load change;

measuring an electrical parameter P of the IGBT that serves as an indicator for reliability or durability against the number N of load changes;

calculating a derivative dP/dN of the electrical parameter P according to the number N of load changes; and comparing the derivative dP/dN with a target value representing a determined service life.

2. The method according to claim 1, wherein the derivative dP/dN is compared with a derivative $(dP/dN)_{Ref}$, measured for a reference element under the same conditions and within the same interval of N load changes.

3. The method according to claim 2, wherein the IGBT is rated as longer-lived in relation to the reference element as long as the condition $$dP/dN < (dP/dN)_{Ref}$$

is satisfied within the interval of N load changes and in that the IGBT is rated shorter-lived in relation to the reference element as long as the condition $$dP/dN > (dP/dN)_{Ref}$$

is satisfied within the interval of N load changes.

4. The method according to claim 2, wherein at least a second derivative $d^2P/dN^2$ is calculated and compared with a corresponding second derivative $(d^2P/dN^2)_{Ref}$ of the reference element.

5. The method according to claim 2, wherein a warning signal is produced if the derivative dP/dN is larger than the target value.

6. The method according to any one of claims 1 to 5, wherein the parameter P is selected from the group consisting of a potential difference between two terminals of the IGBT, an ohmic resistance between two terminals or an ohmic resistance of an IGBT terminal.

7. The method according to claim 6, wherein the IGBT comprises an emitter terminal, an auxiliary emitter terminal and a collector terminal, a resistance ($R_{EH}$) between the emitter terminal and the auxiliary emitter terminal, a resistance of the emitter ($R_E$) or a resistance of the auxiliary emitter ($R_H$), or a collector-emitter voltage ($U_{CEsat}$) is measured against the number N of load changes.

8. A method for estimating the service life of an IGBT, comprising the steps of:

subjecting the IGBT to a periodic load change;

measuring an electrical parameter P of the IGBT that serves as an indicator for reliability or durability against the number N of load changes;

calculating a derivative dP/dN of the electrical parameter P according to the number N of load changes; and comparing the derivative dP/dN with a target value representing a determined service life, wherein the derivative dP/dN is compared with a derivative $(dP/dN)_{Ref}$, measured for a reference element under the same conditions and within the same interval of N load changes, wherein at least a second derivative is calculated, wherein the parameter P is selected from the group consisting of a potential difference between two terminals of the IGBT, an ohmic resistance between two terminals or an ohmic resistance of an IGBT terminal, and wherein the IGBT comprises an emitter terminal, an auxiliary emitter terminal and a collector terminal, a resistance ($R_{EH}$) between the emitter terminal and the auxiliary emitter terminal, a resistance of the emitter ($R_E$) or a resistance of the auxiliary emitter ($R_H$), or a collector-emitter voltage ($U_{CEsat}$) is measured against the number N of load changes.

9. The method according to claim 8, wherein the IGBT is rated as longer-lived in relation to the reference element as long as the condition $$dP/dN < (dP/dN)_{Ref}$$

is satisfied within the interval of N load changes and in that the IGBT is rated shorter-lived in relation to the reference element as long as the condition $$dP/dN > (dP/dN)_{Ref}$$

is satisfied within the interval of N load changes.

10. The method according to claim 8 or 9, wherein a warning signal is produced if the derivative dP/dN is larger than the target value.

* * * * *